United States Patent
Griswold et al.

(10) Patent No.: US 7,902,823 B2
(45) Date of Patent: Mar. 8, 2011

(54) DYNAMIC PARALLEL MAGNETIC RESONANCE IMAGING(DPMRI) WITH SPARSE DATA

(76) Inventors: Mark A. Griswold, Shaker Heights, OH (US); Martin Blaimer, Cleveland Heights, OH (US); Randall Kroeker, Winnipeg (CA)

( * ) Notice: Subject to any disclaimer, the term of this patent is extended or adjusted under 35 U.S.C. 154(b) by 262 days.

(21) Appl. No.: 12/150,790

(22) Filed: May 1, 2008

(65) Prior Publication Data

US 2009/0092303 A1   Apr. 9, 2009

Related U.S. Application Data

(60) Provisional application No. 60/927,235, filed on May 2, 2007.

(51) Int. Cl.
  *G01V 3/00* (2006.01)
  *G06K 9/00* (2006.01)
  *A61B 5/05* (2006.01)
(52) U.S. Cl. ......... 324/307; 324/309; 324/318; 382/131; 600/410
(58) Field of Classification Search .......... 324/300–322; 382/128–131; 600/407–435; 717/106
  See application file for complete search history.

(56) References Cited

U.S. PATENT DOCUMENTS

| | | | | |
|---|---|---|---|---|
| 4,973,111 A * | 11/1990 | Haacke et al. | ................ | 324/309 |
| 7,308,139 B2 * | 12/2007 | Wentland et al. | ............ | 382/181 |
| 7,657,071 B2 * | 2/2010 | Bartesaghi et al. | .......... | 382/128 |
| 7,783,096 B2 * | 8/2010 | Chen et al. | ................... | 382/131 |
| 2002/0091991 A1 * | 7/2002 | Castro | .......................... | 717/106 |
| 2003/0206016 A1 * | 11/2003 | Madore | ....................... | 324/309 |
| 2005/0264287 A1 * | 12/2005 | Griswold et al. | ............. | 324/309 |
| 2006/0281987 A1 * | 12/2006 | Bartesaghi et al. | .......... | 600/410 |
| 2007/0013374 A1 * | 1/2007 | Griswold et al. | ............. | 324/309 |
| 2007/0110290 A1 * | 5/2007 | Chang et al. | .................. | 382/128 |
| 2007/0196007 A1 * | 8/2007 | Chen et al. | ................... | 382/131 |
| 2008/0154115 A1 * | 6/2008 | Fuderer et al. | ................ | 600/410 |
| 2008/0175458 A1 * | 7/2008 | Guo et al. | ..................... | 382/131 |
| 2008/0197844 A1 * | 8/2008 | Ying et al. | .................... | 324/309 |
| 2008/0199063 A1 * | 8/2008 | O'Halloran et al. | .......... | 382/131 |
| 2008/0292167 A1 * | 11/2008 | Todd et al. | .................... | 382/131 |
| 2008/0309336 A1 * | 12/2008 | Griswold et al. | ............. | 324/309 |
| 2009/0001984 A1 * | 1/2009 | Hwang | ........................ | 324/307 |
| 2009/0091322 A1 * | 4/2009 | Posse | ........................... | 324/307 |
| 2009/0092303 A1 * | 4/2009 | Griswold et al. | ............. | 382/131 |
| 2010/0021027 A1 * | 1/2010 | Hartkens et al. | ............. | 382/128 |
| 2010/0086185 A1 * | 4/2010 | Weiss | ........................... | 382/131 |

* cited by examiner

*Primary Examiner* — Melissa J Koval
*Assistant Examiner* — Tiffany A Fetzner
(74) *Attorney, Agent, or Firm* — Kraguljac & Kalnay, LLC

(57) ABSTRACT

Example methods, apparatus, and systems associated with dynamic parallel magnetic resonance imaging (DpMRI) are presented. One example system facilitates separating data associated with a dynamic portion of a dynamic magnetic resonance image from data associated with a static portion of the dynamic magnetic resonance image. The system computes reconstruction parameters for a DpMRI reconstruction processes for both the dynamic portion of the image and the static portion of the image. The example system produces a DpMRI image based on separate reconstructions of the dynamic portion of a dynamic magnetic resonance image and the static portion of a dynamic magnetic resonance image. The separate reconstructions may depend on separate sets of reconstruction parameters and on separated static data and dynamic data.

19 Claims, 12 Drawing Sheets

US 7,902,823 B2

DYNAMIC PARALLEL MAGNETIC RESONANCE IMAGING(DPMRI) WITH SPARSE DATA

CROSS REFERENCE TO RELATED APPLICATIONS

This application claims the benefit of U.S. Provisional Patent 60/927,235, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Dynamic magnetic resonance imaging (MRI) involves creating a sequence of magnetic resonance (MR) images to monitor temporal changes in an object of interest (e.g., tissue structure). Dynamic MRI apparatus seek to acquire images as fast as possible while maintaining a sufficient signal to noise ratio (SNR) to investigate the object being imaged. Partial parallel acquisition (PPA) strategies that facilitate accelerating image acquisition are therefore employed in dynamic MRI.

For example, there are dynamic parallel MRI (DpMRI) approaches based on both TSENSE (time adaptive sensitivity encoding) and TGRAPPA (temporal generalized auto-calibrating partially parallel acquisitions). Both TSENSE and TGRAPPA are based on a time-interleaved phase-encoding (PE) scheme. Conventionally, at high acceleration factors, both TSENSE and TGRAPPA have experienced noise enhancement. This noise enhancement may lead to an unacceptable signal to noise ratio (SNR) in reconstructed images. In both TSENSE and TGRAPPA, a fully Fourier-encoded composite data set may be assembled. This composite data set may be used to calculate parameters (e.g., weights, coil sensitivity profiles) used in parallel image reconstruction. These parameters can then be used to reconstruct individual undersampled time frames.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems and methods concern dynamic parallel MRI (DpMRI) reconstruction of sparse data. The sparse data may be associated with a region in an object of interest where changes are occurring. Changes tend to occur in localized regions within a field of view (FOV). Based on this observation, reconstructions associated with the localized regions may be employed to reduce the geometry factor. The reduction may be possible since fewer signal-containing pixels may fold on top of each other in the sparse images. A reconstructed subtraction image may be added to a composite image from which data associated with a changing portion was removed before being reconstructed to obtain a final image. This approach may be employed in DPMRI cardiac sessions, CE angiography, and so on. "Dynamic data," as used herein, refers to data associated with a changing portion of a DpMRI image. Therefore, "Dynamic calibration data," and so on, as used herein, similarly refer to calibration data associated with a changing portion of a DpMRI image.

Example systems and methods may acquire data using a time-interleaved phase-encoding (PE) scheme. Example systems and methods assemble a composite data set that includes signal from multiple frames. This composite data set may be generated by summing a set of under-sampled time frames.

Figure 1:
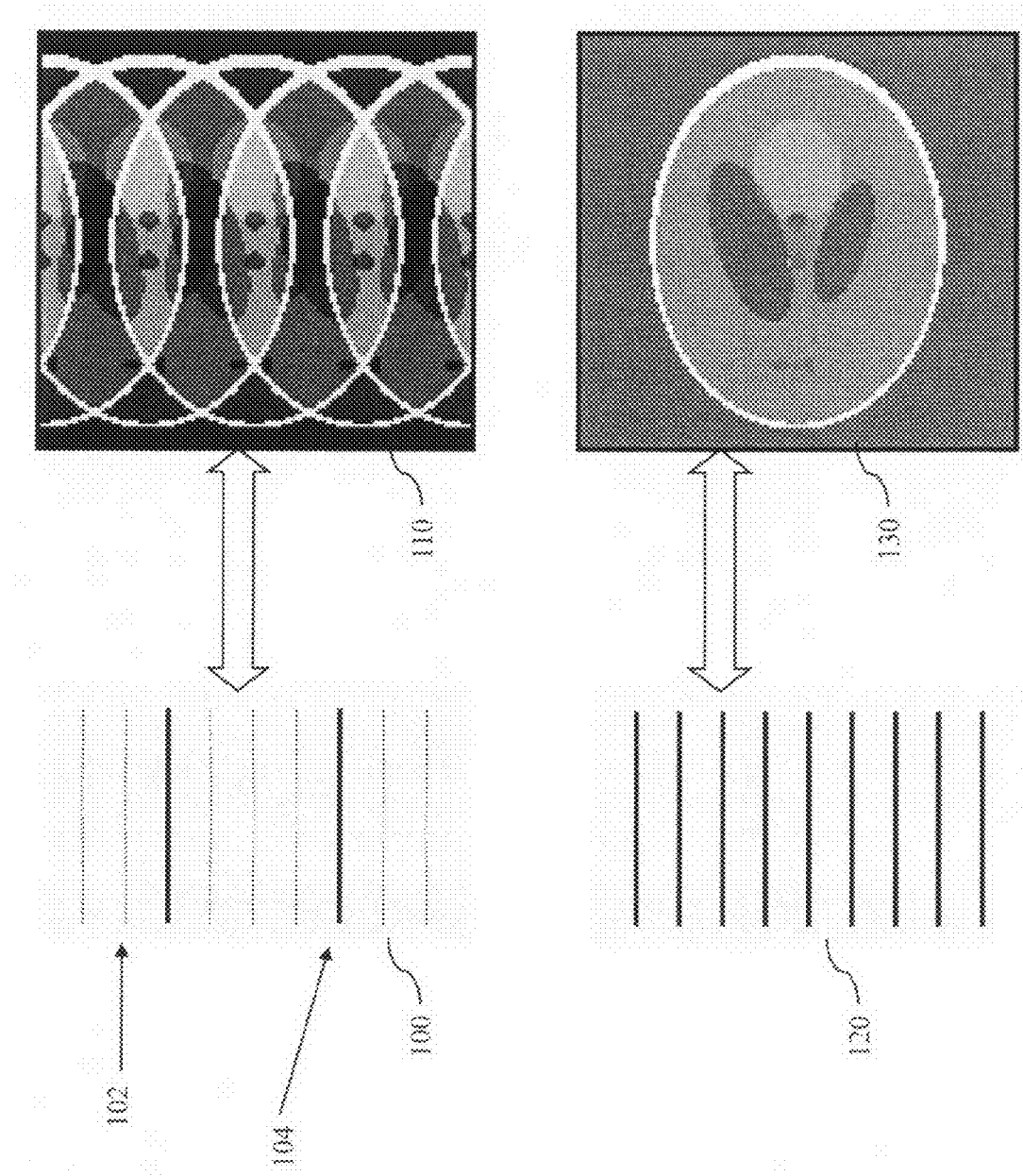
FIG. 1 illustrates images reconstructed from undersampled and fully sampled data sets using DpMRI.

FIG. 1 illustrates an image 110 produced from a Fourier Transform (FT) of an under-sampled time frame 100. Frame 100 includes both an acquired line (e.g., 104) and an unacquired line (e.g., 102). FIG. 1 also illustrates an image 130 reconstructed from a fully Fourier-encoded composite data set 120. Image 110 includes several aliasing artifacts associated with under-sampling k-space while image 130 does not.

pMRI data are collected in the spatial frequency domain (k-space). Scan time is related to the number of data samples collected from k-space. The number of data samples required for accurate (e.g., alias-free) reconstruction is related to reconstruction approaches and to calibration approaches as well as the performance of the array used for detection. These approaches are governed, at least in part, by the Nyquist criterion. However, k-space can be under-sampled, which involves collecting fewer data samples than necessary to satisfy the Nyquist criterion. Under-sampling, without additional processing, can cause Fourier Transform reconstructions to exhibit aliasing artifacts as illustrated in image 110. However, reconstruction parameters can be computed from combinations of under-sampled data acquired in the various coils of the array to mitigate the effects of under-sampling.

Figure 2:
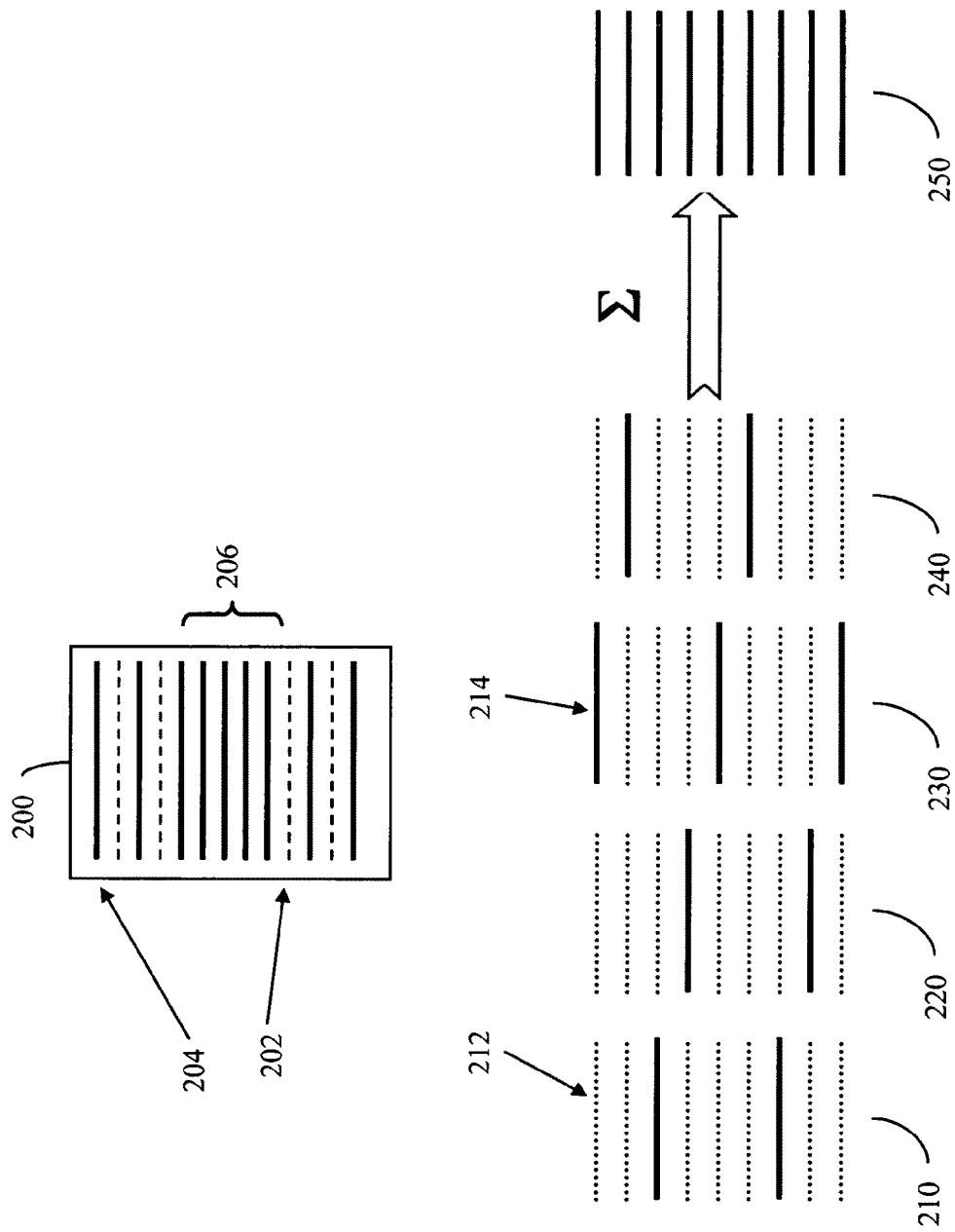
FIG. 2 illustrates assembling calibration data employed in DpMRI using variable density acquisition and time-interleaved acquisition.

FIG. 2 illustrates two different approaches for assembling calibration data employed in DpMRI. Dynamic calibration data may be acquired to facilitate reconstructions of under-sampled time frames. A variable density acquisition scheme may produce data set 200. Data set 200 includes acquired lines (e.g., line 204) and un-acquired lines (e.g., line 202). In this variable density acquisition scheme, the center of k-space may be sampled in a manner that satisfies the Nyquist criterion while more distant portions of k-space may be under-sampled. Thus, a portion of data set 200 (e.g., lines 206) may be useable as calibration data. A time-interleaved phase-encoding approach may produce data set 250. Individual under-sampled frames (e.g., frame 210, frame 220, frame 230, frame 240) may be acquired and then summed together to produce the composite data set 250. Individual under-sampled frames may include acquired lines (e.g., line 214) and not acquired lines (e.g., line 212). The composite data set 250 may then be used to compile a calibration data set.

Figure 3:
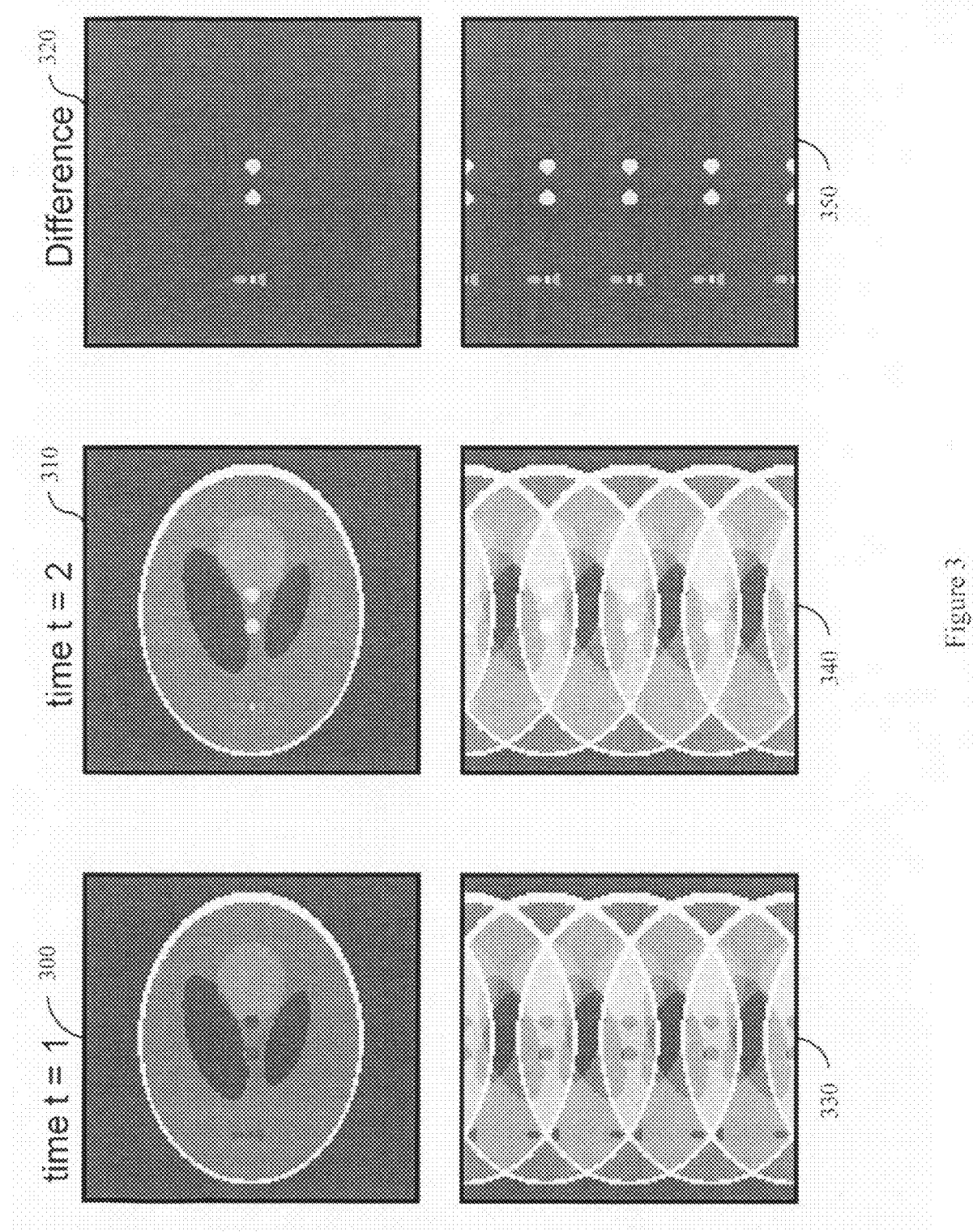
FIG. 3 illustrates separation of data associated with a dynamic portion of a DpMRI image from data associated with a static portion of a DpMRI image.

FIG. 3 illustrates that reconstruction of sparse data from a small region associated with a dynamic portion of an object reveals less pixel overlap. An image of an object at a first time is illustrated in image 300. An image of the object at a second time is illustrated in 310. Some portions of the object yielded different MR signals at the different times and therefore images 300 and 310 are different. The differences between them are illustrated in 320. The differences are confined to a small region. In DpMRI, it may be the differences 320 that are of interest. For example, when imaging a beating heart or an inflow of blood spins, the static surrounding structure may not be of interest while the parts that moved are of interest.

While images 300, 310, and 320 are associated with a reconstruction from a fully sampled data set, images 330, 340, and 350 are associated with a reconstruction from an under-sampled data set. Once again image 350 is the result of subtracting 330 from 340 and thus illustrates only the dynamic portion of the object being imaged. Image 350 contains several artifacts associated with under-sampling. Subtracting a second time frame (e.g., images under time t=2) from a first time frame (e.g., images under time t=1) reveals differences (e.g., images under "Difference") between the time frames. These differences may be data of interest in a DpMRI acquisition. Areas where there are changes from another image that includes static portions can be extracted by subtracting a composite "static" image from a frame of interest. While a "static" image is described, one skilled in the art will appreciate that a "static" image may include some data associated with a dynamic portion of an image. For example, a "static" image may be produced from ten frames from a one thousand frame acquisition. The ten frames may store primarily information associated with a static portion of a FOV but may also have some information associated with a dynamic portion of a FOV. Reconstruction of dynamic data can then be done. An image of dynamic data can then be added to a static image from which a dynamic data was removed. This may reduce noise enhancement because reconstruction conditions are improved. For example, reconstruction conditions may be improved when fewer pixels overlap in sparse images. Thus, careful preparation of a composite static image can facilitate improved dynamic imaging.

Figure 4:
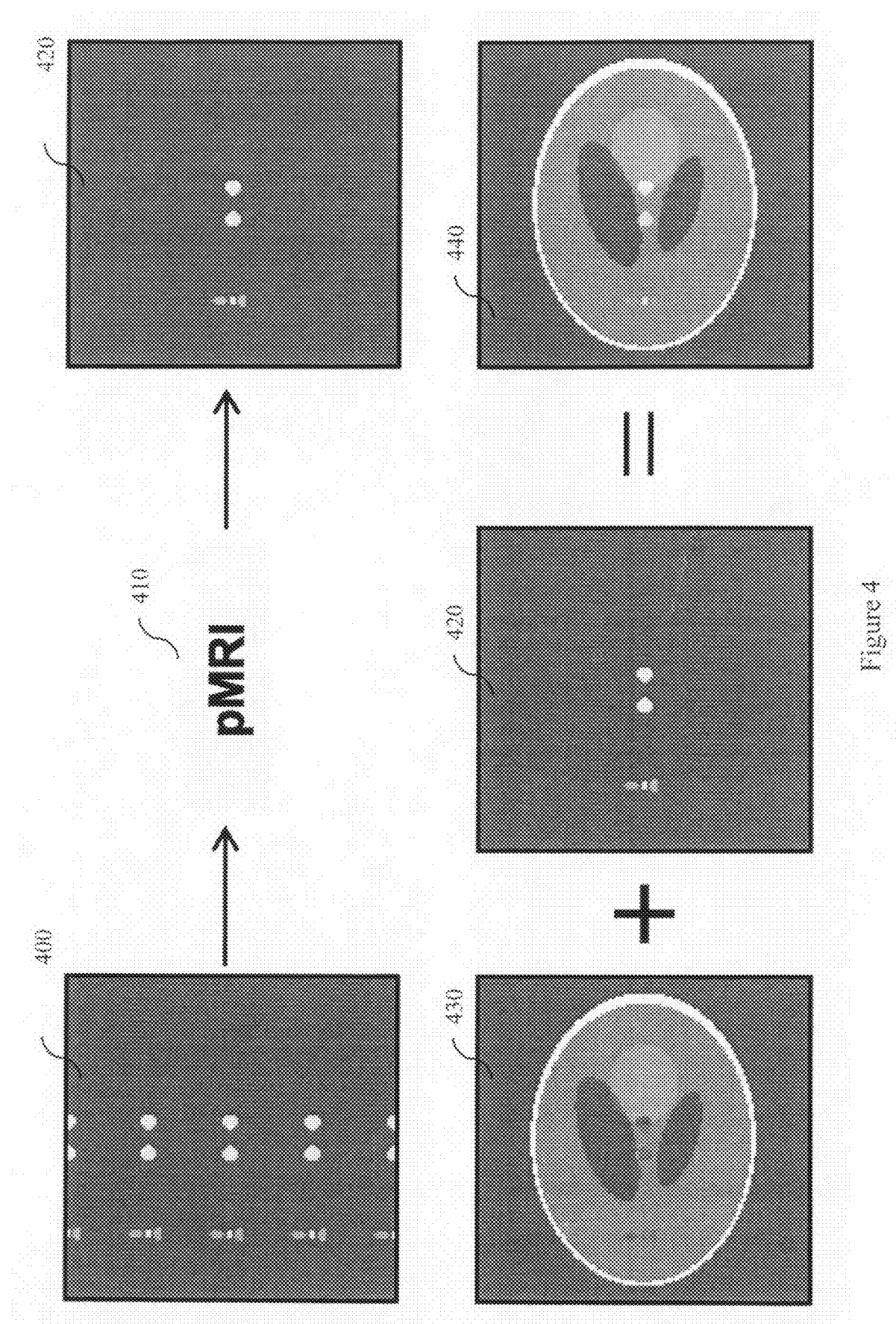
FIG. 4 illustrates reconstruction of dynamic information that includes adding a reconstructed image of a dynamic region into a reconstructed static image from which data associated with the dynamic region was subtracted.

FIG. 4 illustrates pMRI reconstruction of information associated with a changing portion of a DpMRI image and adding this information back to a static image. This illustrates one approach for DpMRI using sparse data. Complete data may be collected to produce a reconstruction of a static image. With the static image "fixed", pMRI of just the information associated with the changing portion can be undertaken.

FIG. 4 illustrates how a final image 440 can be built from an image 420 of a dynamic portion of an object being imaged and an image 430 of a static portion of the object being imaged. The image 430 of the static portion may have been reconstructed from a fully sampled data set. The image 420 may have been reconstructed from an image 400 associated with an under-sampled data set. The image 400 may have been processed using a calibration data set associated with a pMRI reconstruction process 410. Image 400 may have been acquired similarly to how image 350 (FIG. 3) was acquired, by subtracting static portions of an image from dynamic portions of a frame. The static portions of the image may have been represented in a static composite data set.

Thus, FIG. 4 illustrates a two step process that includes performing a pMRI reconstruction of information associated with a changing portion of a DpMRI image and then producing a final image by adding the information associated with the changing portion to another reconstructed static image. The pMRI reconstruction may rely on calibration data to remove aliasing artifacts associated with under sampling k-space. The under-sampling may occur to allow very short acquisition times to facilitate observing changes that occur very rapidly and/or that have very short durations.

Figure 5:
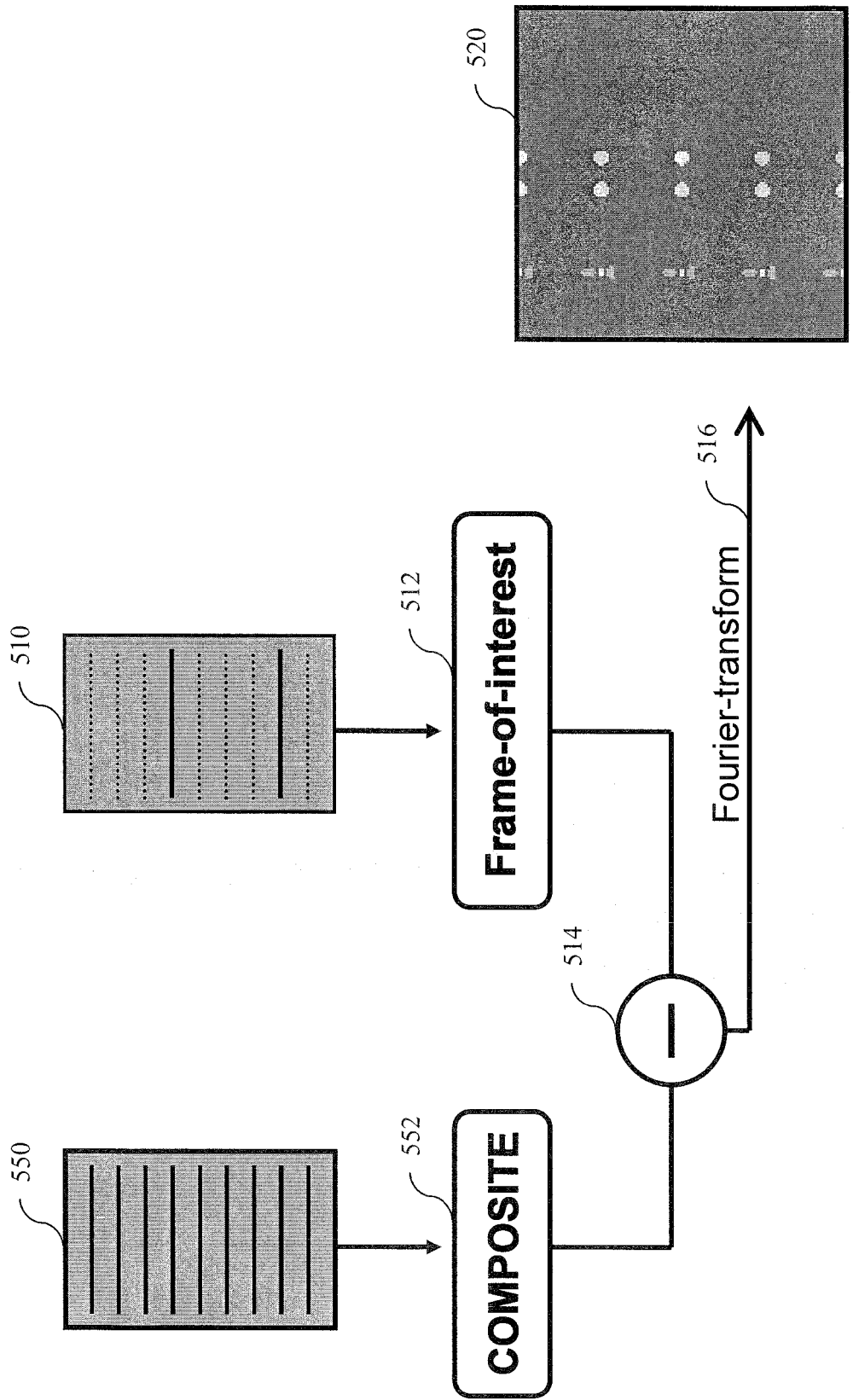
FIG. 5 illustrates subtracting a static composite data set from an undersampled frame of interest to produce an undersampled dynamic data.

FIG. 5 illustrates subtracting 514 a static composite data set 552 from an under-sampled frame of interest 512 to produce an under-sampled dynamic data 520 after a Fourier transform 516. The static composite data set 552 may be produced from a fully sampled data set 550. The frame of interest 512 may be an under-sampled frame 510. The under-sampled dynamic data 520 can be used in reconstruction to produce dynamic data that can be added back to a static image. However, before using the under-sampled data 520 in this manner, dynamic calibration data is computed to facilitate more accurate reconstruction. Under-sampled dynamic data 520 may correspond to image 400 (FIG. 4). The dynamic calibration data may be employed by the pMRI process 410 (FIG. 4). Recall that "dynamic data" refers to data associated with a changing portion of a DpMRI image and that therefore, "dynamic calibration data," and so on, similarly refer to calibration data associated with a changing portion of a DpMRI image.

Figure 6:
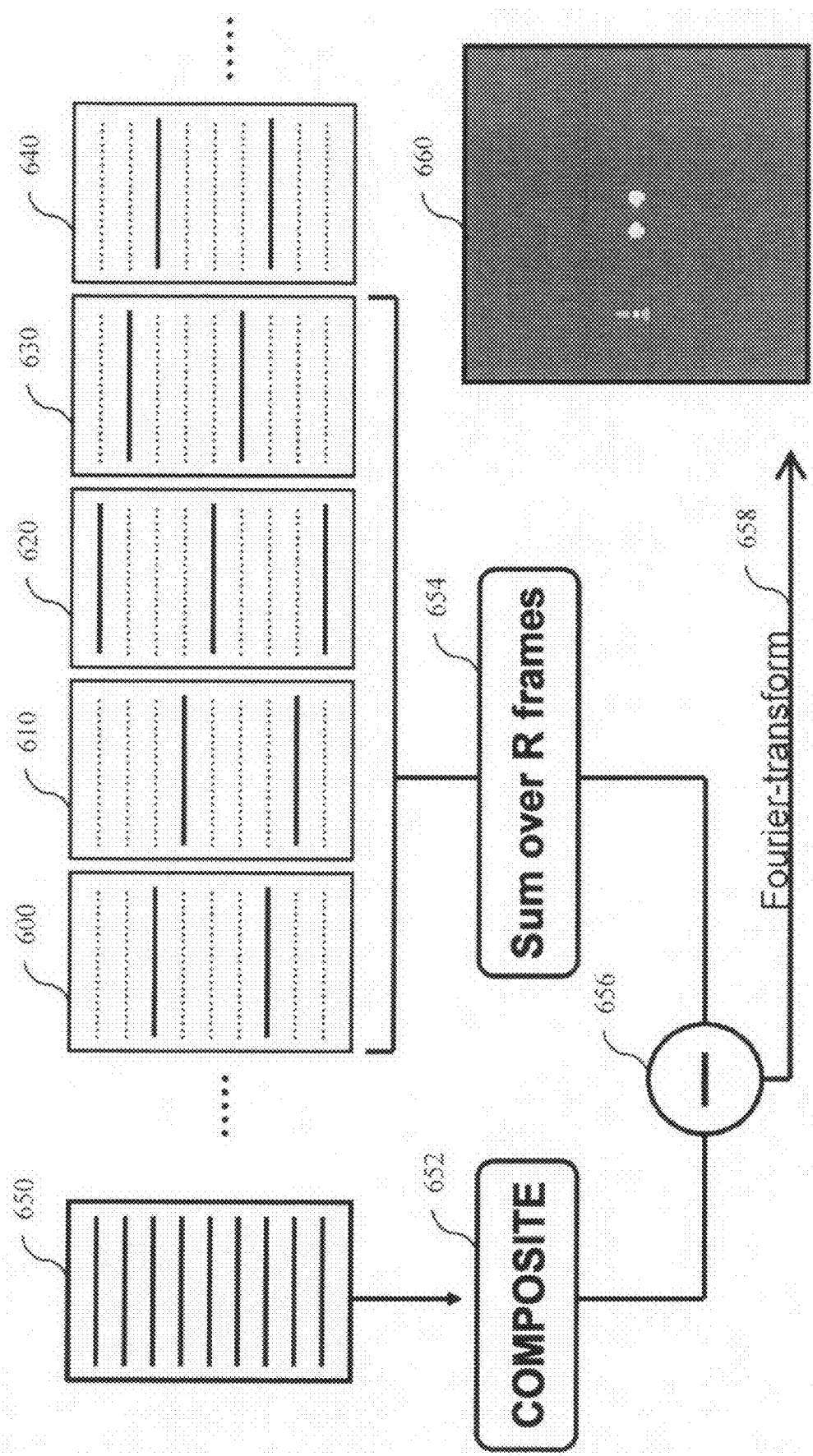
FIG. 6 illustrates subtracting a static composite data set from the calibration data for a frame of interest to obtain dynamic calibration data.

FIG. 6 illustrates producing a composite dynamic data set 654 from members of a set of under-sampled frames (e.g., frame 600, frame 610, frame 620, frame 630, frame 640). The composite dynamic data set 654 may be used as a calibration data set. FIG. 6 also illustrates subtracting 656 a static composite data set 652 from the composite dynamic data set 654 for a frame of interest to obtain dynamic calibration data 660 after a Fourier-transform 658. The static composite data set 652 may be associated with a fully sampled data set 650. The dynamic calibration data 660 can be used in reconstructing the under-sampled dynamic data associated with a frame of interest (e.g., frame 610) after static data has been removed from the frame of interest. Thus, like a reference data set for an entire image can be used to compute calibration data that is used in reconstructing an under-sampled data set, so too can dynamic calibration data be computed to facilitate reconstruction of under-sampled dynamic data. This reconstruction from the under-sampled dynamic data can then be added to the reconstruction of the static data.

Figure 7:
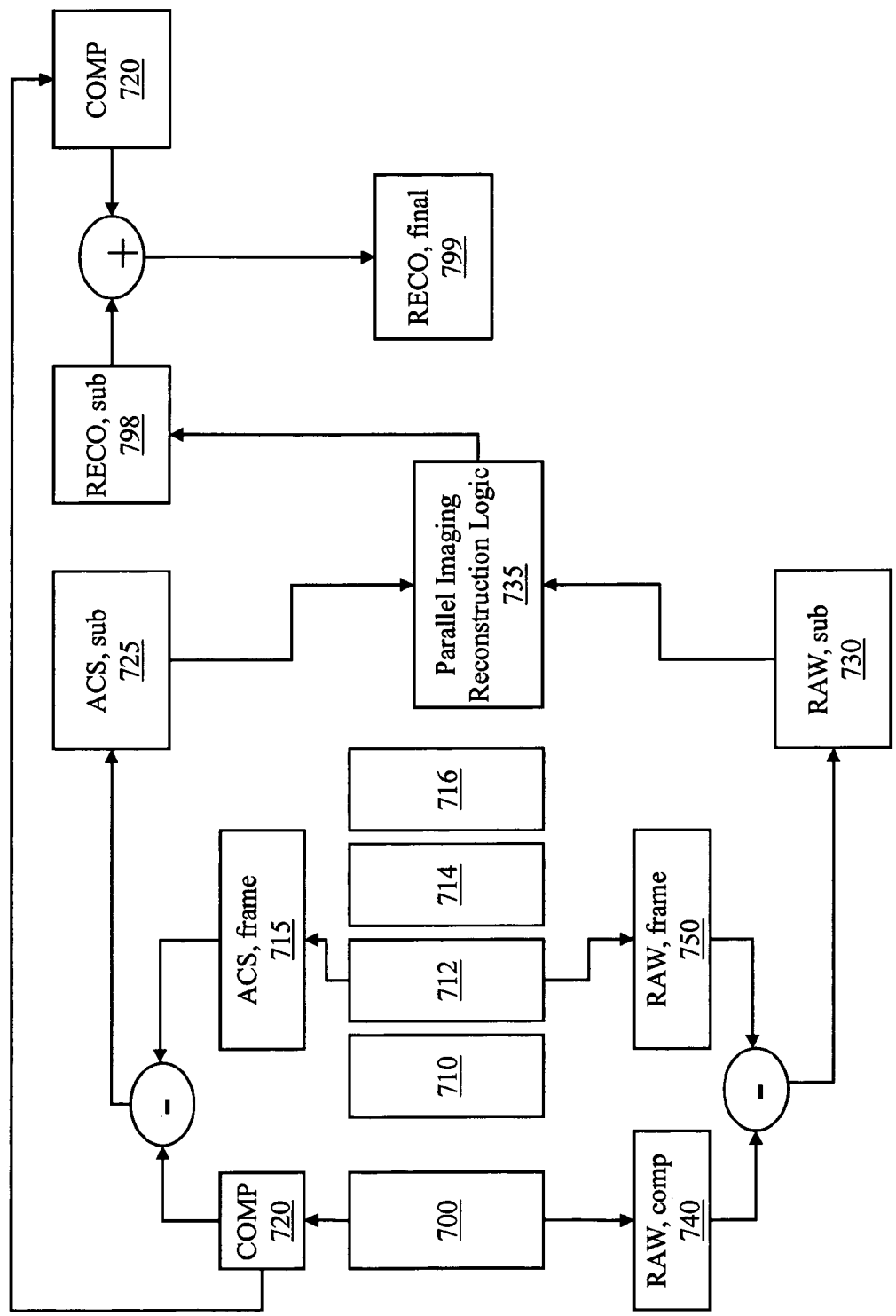
FIG. 7 illustrates data sets and processing associated with DpMRI using sparse data.

FIG. 7 illustrates example data sets and processing associated with DpMRI using sparse data. This sparse data may be associated with a sub-region in a FOV. The sub-region may be restricted to an area where changes occur. Prior to other processing, a fully Fourier-encoded composite data set (COMP) 720 may be assembled using, for example, a time-interleaved phase-encoding (PE) scheme. This static composite data set (COMP) 720 may be fully Fourier-encoded and may not require further processing. The complete data set 720 may be assembled from a fully sampled data set 700. A subtraction data set (RAW, sub) 730 may be created by subtracting corresponding k-space lines of the composite data set (RAW, comp) 740 from raw data of a single time frame (RAW, frame) 750. (RAW, sub) 730 contains information about changes with respect to the static composite data. The single frame (RAW, frame) 750 may be one of a member of under-sampled frames (e.g., frame 710, frame 712, frame 714, frame 716).

Aliased pixels may be separated using a parallel imaging reconstruction logic 735. The parallel imaging reconstruction logic 735 may use, for example, a GRAPPA technique. The parallel imaging reconstruction logic 735 may rely on the dynamic auto-calibration signal (ACS, sub) 725. (ACS, sub) 725 may be generated by subtracting COMP 720 from the calibration data of a single time-frame (ACS, frame) 715. (ACS, sub) 725 may contain information associated with locations at which temporal changes occur. The final reconstruction (RECO, final) 799 of a time frame may be obtained by adding the reconstructed subtraction data (RECO, sub) 798 to COMP 720. The reconstructed subtraction data (RECO, sub) may be reconstructed using dynamic calibration data.

The example systems and methods illustrate a self-calibrated parallel MRI technique for DpMRI using sparse data associated with regions where changes occur during dynamic imaging. Compared with conventional pMRI, example systems and methods demonstrate enhanced SNR. The SNR is enhanced due to improved reconstruction conditions since fewer pixels overlap in the sparse images.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 8:
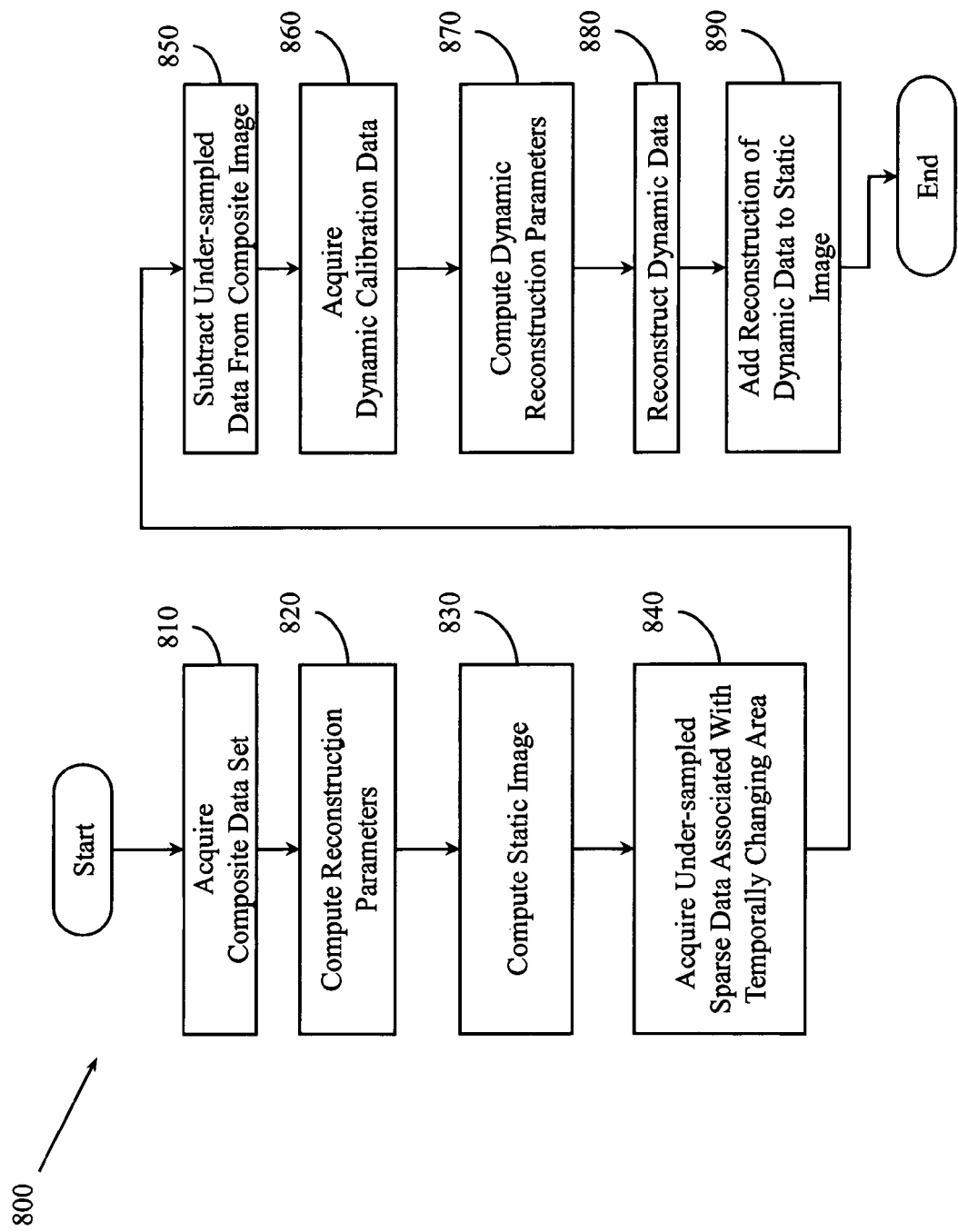
FIG. 8 illustrates a method associated with DpMRI and sparse dynamic data.

FIG. 8 illustrates a method 800 associated with DpMRI. Method 800 may include, at 810, acquiring a fully Fourier-encoded composite data set. The composite data set may include data associated with a representation of a static portion of an object of interest. Method 800 may also include, at 820, computing reconstruction parameters. One skilled in the art will appreciate that different approaches may be taken to compute reconstruction parameters. Additionally, method 800 may include, at 830, computing a static image from the composite data set. In one example, the static image may be computed from additional and/or alternate data. The static image may represent a portion of an object of interest that is not experiencing temporal changes. While a "static" image is described, it is to be appreciated that a "static" image may not be a purely static image and may include some dynamic information.

Method 800 may also include, at 840, acquiring under-sampled sparse data. This under-sampled sparse data may include information concerning an area in which temporal changes are occurring. This data may be, at 850, extracted by subtracting the static composite data set from the frame of interest. This dynamic data may be used to reconstruct an image of the dynamic portion of the object being imaged. Reconstruction of this dynamic data may benefit from computing reconstruction parameters associated with the dynamic area.

Thus, method 800 may also include, at 860, acquiring (e.g., assembling) dynamic calibration data. The dynamic calibration data may be assembled from under-sampled frames that neighbor or are in close proximity to the under sampled sparse data computed at associated with 840. With the calibration data available, method 800 may proceed, at 870, by computing dynamic reconstruction parameters that can then be used, at 880, to reconstruct the dynamic data. Method 800 may also include, at 890, combining the image reconstructed from the dynamic data to the static image computed at 830.

Figure 9:
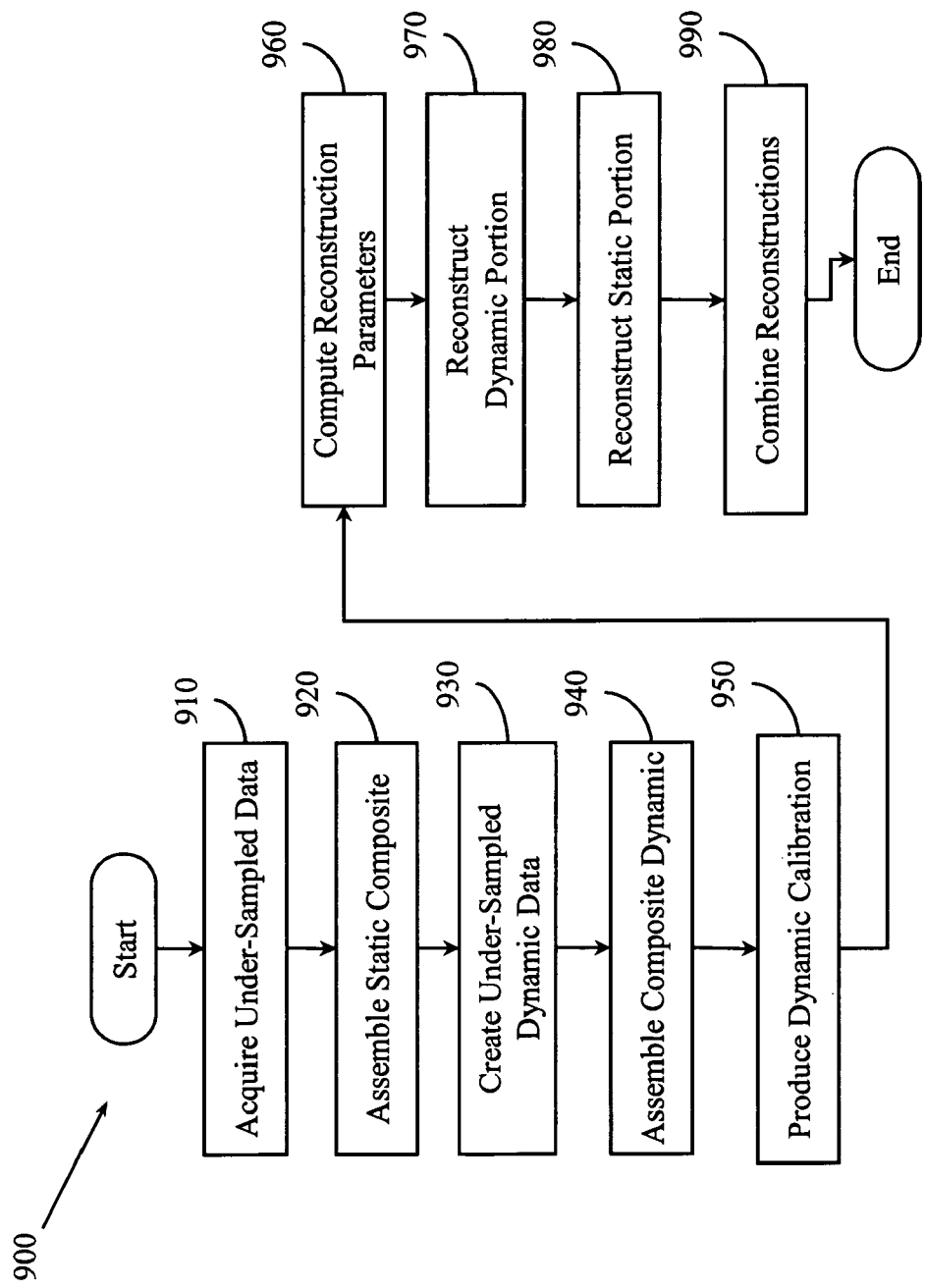
FIG. 9 illustrates a method associated with DpMRI and sparse dynamic data.

FIG. 9 illustrates a method 900. Method 900 may be performed by a DpMRI apparatus as controlled by a computer running computer executable instructions provided on a computer-readable medium. Method 900 includes, at 910, acquiring under-sampled data sets. In one example, acquiring the set of under-sampled data sets includes controlling the pMRI apparatus to acquire under-sampled data sets using an interleaved approach.

Method 900 also includes, at 920, assembling a static composite data set from the under-sampled data sets. The static composite data includes data associated with a static portion of a DPMRI image. In one example, assembling the static composite data set includes combining data associated with a static portion of the object to be imaged from at least two under-sampled data sets. The static composite data set may be used to compute reconstruction parameters and for reconstruction. In another example, assembling the static composite data set may include controlling a DpMRI apparatus to acquire a set of lines from the center of k-space associated with the object to be imaged. In yet another example, the static composite data set is assembled from data acquired in a separate scan using a full acquisition. To facilitate reconstruction, in one example, the static composite data set may be assembled until it satisfies the Nyquist criterion. While a "static" composite data set is described, it is to be appreciated that the "static" composite data set may include some information associated with a dynamic portion of an object being imaged.

Method 900 also includes, at 930, creating an under-sampled dynamic data set from a frame of interest in the under-sampled data sets and the static composite data set. The under-sampled dynamic data set may be produced by subtracting the static composite data set from a frame of interest. The subtraction may yield a data set that has only data associated with a dynamic portion of an image.

Method 900 also includes, at 940, assembling a composite dynamic data set from members of the set of under-sampled data sets. The composite dynamic data set may include data from two or more frames acquired by the DpMRI. The frames may be related to (e.g., neighbor) a frame of interest and thus may be used to create calibration data for a dynamic frame of interest.

Method 900 also includes, at 950, producing a dynamic calibration data set from the composite dynamic data set and the static composite data set. In one example, the dynamic calibration data set may be assembled from data acquired using a time interleaved acquisition, and/or a variable-density acquisition. In another example, the dynamic calibration data set may be computed from central k-space data associated with the static composite data set and central k-space data associated with an under-sampled data set. In another example, the dynamic calibration data set may be computed from at least two under-sampled data sets and the static composite data set.

Method 900 also includes, at 960, computing a set of dynamic reconstruction parameters from the dynamic calibration data set. One skilled in the art will appreciate that the dynamic reconstruction parameters may be associated with, for example, a partial parallel acquisition technique (e.g., GRAPPA). Recall that "dynamic reconstruction parameters" refer to reconstruction parameters associated with a changing portion of a DpMRI image.

Method 900 also includes, at 970, reconstructing an image of a dynamic portion of the object being imaged. The image may be reconstructed from the frame of interest using the dynamic reconstruction parameters. Method 900 also includes, at 980, reconstructing an image of a static portion of the object being imaged. The image may be reconstructed from the static composite data set. In one example, reconstructing the image of the dynamic portion of the object being imaged includes performing a parallel MRI reconstruction technique (e.g., GRAPPA).

Method 900 also includes, at 990, producing a final image by combining the reconstructed image of the dynamic portion of the object being imaged to the reconstructed image of the static portion of the object being imaged. In one example, method 900 may also include displaying the final image.

Figure 10:
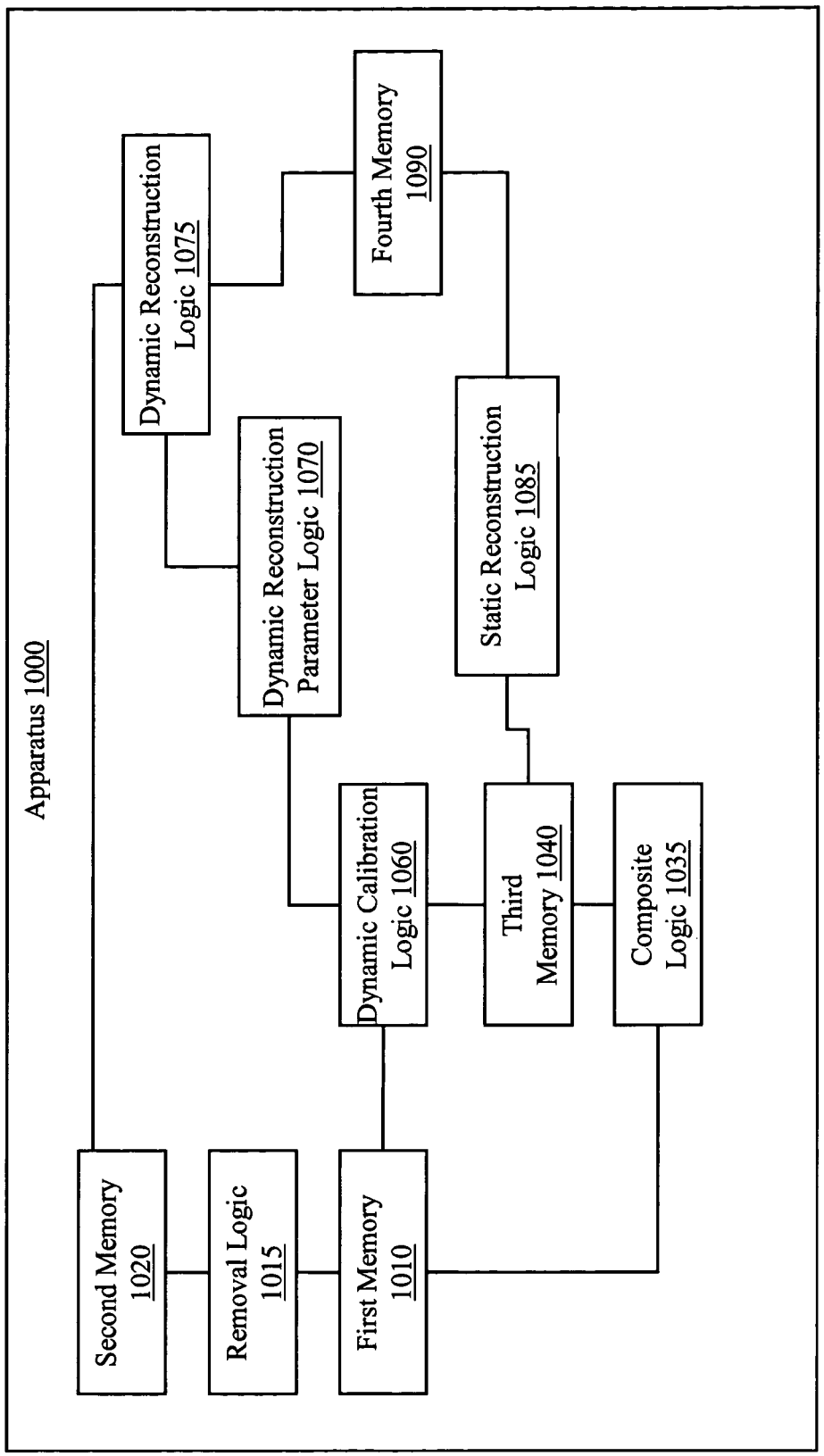
FIG. 10 illustrates an apparatus associated with DpMRI and sparse dynamic data.

FIG. 10 illustrates an apparatus 1000. Apparatus 1000 includes a first memory 1010 that is populated with sets of under-sampled data. The sets of under-sampled data may correspond to frames acquired from an object being imaged. Thus, a set of under-sampled data may include data associated with a static portion of the object and data associated with a dynamic portion of the object. Example systems and methods may operate separately on sparse data associated with a dynamic portion of a DpMRI image and on data associated with a static portion of a DpMRI image.

Thus, apparatus 1000 also includes a second memory 1020 that stores dynamic data created by a first removal logic 1015. The first removal logic 1015 may remove data associated with the static portion of the object from a set of under-sampled data. Thus, in one example, the second memory 1020 may store a frame having only data associated with a dynamic portion of a DpMRI image.

While individual frame data may be extracted, composite data may also be computed. Thus, apparatus 1000 includes a third memory 1040 to store a static composite data created by a composite logic 1035. The static composite data may satisfy the Nyquist criteria and thus may be used for creating reconstruction parameters and/or for reconstruction.

Apparatus 1000 also includes a dynamic calibration logic 1060 that creates a dynamic calibration data set from sets of under-sampled data and the static composite data. In one example, the dynamic calibration logic 1060 may subtract the static composite data from a frame of interest in the under-sampled data to produce the dynamic calibration data set.

With the dynamic calibration data set available, a dynamic reconstruction parameter logic 1070 may compute a set of dynamic reconstruction parameters from the dynamic calibration data. These dynamic reconstruction parameters may then be employed to reconstruct a frame of interest. Therefore, apparatus 1000 also includes a dynamic reconstruction logic 1075 to reconstruct an image of a dynamic portion of the object from the frame of interest and the dynamic reconstruction parameters. Similarly, apparatus 1000 includes a static reconstruction logic 1085 to reconstruct an image of a static portion of the object from the static composite data and the static reconstruction parameters. This reconstruction may be, for example, simply a Fourier transform and may not be, for example, a parallel reconstruction.

In one example the dynamic reconstruction logic 1075 may perform a partially parallel reconstruction using the dynamic reconstruction parameters and the frame of interest. The partially parallel reconstruction may be, for example, a GRAPPA reconstruction. Similarly, the static reconstruction logic 1085 may perform a partially parallel reconstruction (e.g., GRAPPA).

Apparatus 1000 includes a fourth memory 1090 to store a combination of the image of the dynamic portion of the object and the image of the static portion of the object. The combination may be, for example, displayed from the fourth memory 1090, provided to displaying apparatus, provided to analysis logics, and so on.

Figure 11:
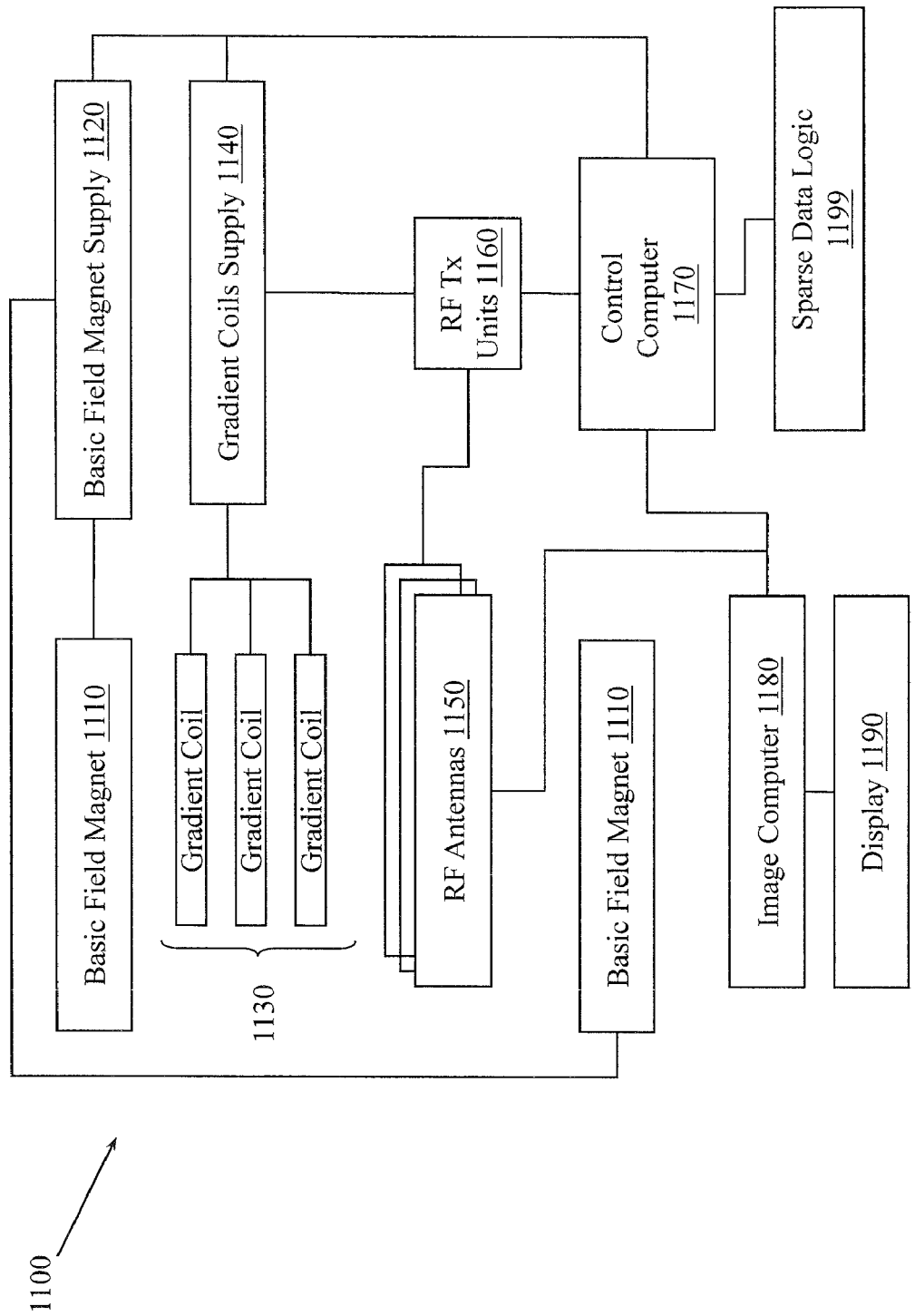
FIG. 11 illustrates an MRI apparatus configured with a sparse data logic.

FIG. 11 illustrates an MRI apparatus 1100 configured with a sparse data logic 1199. Logic 1199 facilitates separating sparse data associated with a dynamic portion of a FOV from data associated with a static portion of a FOV. The logic 1199 may be configured with elements of example apparatus described herein and/or may perform example methods described herein. In one example, sparse data logic 1199 may facilitate providing a combined image from separately reconstructed images corresponding to a dynamic portion of a FOV and a static portion of a FOV.

The apparatus 1100 includes a basic field magnet(s) 1110 and a basic field magnet supply 1120. Ideally, the basic field magnets 1110 would produce a uniform $B_0$ field. However, in practice, the $B_0$ field may not be uniform, and may vary over an object being imaged by the MRI apparatus 1100. MRI apparatus 1100 includes gradient coils 1130 configured to emit gradient magnetic fields like $G_S$, $G_P$ and $G_R$. The gradient coils 1130 may be controlled, at least in part, by a gradient coils supply 1140. In some examples, the timing, strength, and orientation of the gradient magnetic fields may be controlled, and thus selectively adapted during an MRI procedure.

MRI apparatus 1100 includes a set of RF antennas 1150 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 1150 may be controlled, at least in part, by a set of RF transmission units 1160. An RF transmission unit 1160 may provide a signal to an RF antenna 1150.

The gradient coils supply 1140 and the RF transmission units 1160 may be controlled, at least in part, by a control computer 1170. In one example, the control computer 1170 may be programmed to control an MRI device as described herein. The magnetic resonance signals received from the RF antennas 1150 can be employed to generate an image and thus may be subject to a transformation process like a two dimensional fast Fourier Transform that generates pixilated image data. The transformation can be performed by an image computer 1180 or other similar processing device. The image data may then be shown on a display 1190. While FIG. 11 illustrates an example MRI apparatus 1100 that includes various components connected in various ways, it is to be appreciated that other MRI apparatus may include other components connected in other ways.

Figure 12:
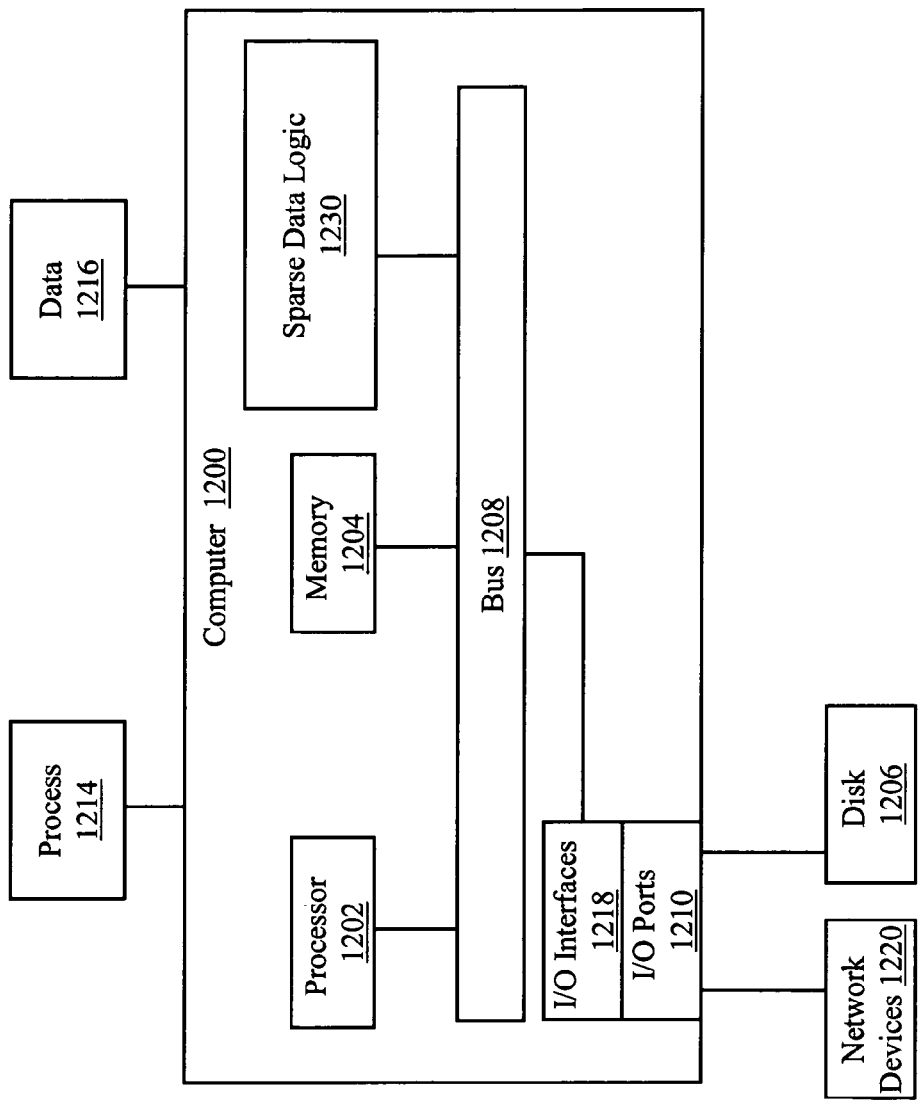
FIG. 12 illustrates an example computing device in which example systems and methods, and equivalents, may operate.

FIG. 12 illustrates an example computing device in which example methods described herein, and equivalents, may operate. The example computing device may be a computer 1200 that includes a processor 1202, a memory 1204, and input/output ports 1210 operably connected by a bus 1208. In one example, the computer 1200 may include a sparse data logic 1230 to facilitate separating sparse data associated with a dynamic portion of a DpMRi image from data associated with a static portion of the image. In different examples, the logic 1230 may be implemented in hardware, software, firmware, and/or combinations thereof. While the logic 1230 is illustrated as a hardware component attached to the bus 1208, it is to be appreciated that in one example, the logic 1230 could be implemented in the processor 1202.

Thus, logic 1230 may provide means (e.g., hardware, software, firmware) for separating data associated with a dynamic portion of a dynamic magnetic resonance image from data associated with a static portion of the dynamic magnetic resonance image. The separation may be performed by, for example, a subtraction logic. The means may be implemented, for example, as an ASIC programmed to control an MR apparatus. The means may also be implemented as computer executable instructions that are presented to computer 1200 as data 1216 that are temporarily stored in memory 1204 and then executed by processor 1202. Logic 1230 may also provide means (e.g., hardware, software, firmware) for computing a first set of reconstruction parameters for a parallel dynamic magnetic resonance reconstruction process based on data associated with the dynamic portion of the dynamic magnetic resonance image.

Logic 1230 may also provide means for constructing a dynamic magnetic resonance image based on separate reconstructions of the dynamic portion of a dynamic magnetic resonance image and the static portion of a dynamic magnetic resonance image. The separate reconstructions may depend on different reconstruction parameters and may be performed in different manners (e.g., parallel, not parallel).

Generally describing an example configuration of the computer 1200, the processor 1202 may be a variety of various processors including dual microprocessor and other multiprocessor architectures. A memory 1204 may include volatile memory and/or non-volatile memory. Non-volatile memory may include, for example, ROM, PROM, and so on. Volatile memory may include, for example, RAM, SRAM, DRAM, and so on.

A disk 1206 may be operably connected to the computer 1200 via, for example, an input/output interface (e.g., card, device) 1218 and an input/output port 1210. The disk 1206 may be, for example, a magnetic disk drive, a solid state disk drive, a floppy disk drive, a tape drive, a Zip drive, a flash memory card, a memory stick, and so on. Furthermore, the disk 1206 may be a CD-ROM drive, a CD-R drive, a CD-RW drive, a DVD ROM, and so on. The memory 1204 can store a process 1214 and/or a data 1216, for example. The disk 1206 and/or the memory 1204 can store an operating system that controls and allocates resources of the computer 1200.

The bus 1208 may be a single internal bus interconnect architecture and/or other bus or mesh architectures. While a single bus is illustrated, it is to be appreciated that the computer 1200 may communicate with various devices, logics, and peripherals using other busses (e.g., PCIE, 13124, USB, Ethernet). The bus 1208 can be types including, for example, a memory bus, a memory controller, a peripheral bus, an external bus, a crossbar switch, and/or a local bus.

The computer 1200 may interact with input/output devices via the i/o interfaces 1218 and the input/output ports 1210. Input/output devices may be, for example, a keyboard, a microphone, a pointing and selection device, cameras, video cards, displays, the disk 1206, the network devices 1220, and so on. The input/output ports 1210 may include, for example, serial ports, parallel ports, and USB ports. The computer 1200 can operate in a network environment and thus may be connected to the network devices 1220 via the i/o interfaces 1218, and/or the i/o ports 1210. Through the network devices 1220, the computer 1200 may interact with a network. Through the network, the computer 1200 may be logically connected to remote computers. Networks with which the computer 1200 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer executable instructions that when executed by a computer associated with a pMRI (parallel Magnetic Resonance Imaging) apparatus cause the pMRI apparatus to perform a method, the method comprising:
   acquiring under-sampled data sets;
   assembling a static composite data set from the under-sampled data sets;
   creating an under-sampled dynamic data set from a frame of interest in the under-sampled data sets and the static composite data set;

assembling a composite dynamic data set from the under-sampled dynamic data sets;
producing a dynamic calibration data set from the composite dynamic data set and the static composite data set;
computing a set of dynamic reconstruction parameters from the dynamic calibration data set;
reconstructing an image of a dynamic portion of the object being imaged based, at least in part, on the under-sampled dynamic data from the frame of interest and the dynamic reconstruction parameters;
reconstructing an image of a static portion of the object being imaged based, at least in part, on the static composite data set; and
producing a final image by combining the reconstructed image of the dynamic portion of the object being imaged with the reconstructed image of the static portion of the object being imaged.

2. The non-transitory computer-readable medium of claim 1, where the method includes displaying the final image.

3. The non-transitory computer-readable medium of claim 1, where acquiring the under-sampled data sets includes controlling the pMRI apparatus in order to acquire under-sampled data using a time-interleaved approach.

4. The non-transitory computer-readable medium of claim 1, where assembling the static composite data set includes combining data from two or more under-sampled data sets.

5. The non-transitory computer-readable medium of claim 1, where assembling the static composite data set includes controlling the pMRI apparatus in order to acquire a set of lines from the center of k-space associated with the object to be imaged.

6. The non-transitory computer-readable medium of claim 1, where the static composite data set is assembled from data acquired in a separate scan using a full acquisition.

7. The non-transitory computer-readable medium of claim 1, where the dynamic calibration data set is assembled from data acquired using one or more of, a time interleaved acquisition, and a variable-density acquisition.

8. The non-transitory computer-readable medium of claim 1, where the dynamic calibration data set is computed from central k-space data associated with the static composite data set and central k-space data associated with the under-sampled data sets.

9. The non-transitory computer-readable medium of claim 1, where the dynamic calibration data set is computed from two or more under-sampled data sets and the static composite data set.

10. The non-transitory computer-readable medium of claim 1, where reconstructing the image of the dynamic portion of the object being imaged includes performing a parallel MRI reconstruction technique.

11. The non-transitory computer-readable medium of claim 10, the parallel MRI reconstruction technique being a generalized auto-calibrating partially parallel acquisition (GRAPPA) technique.

12. A pMRI (parallel Magnetic Resonance Imaging) apparatus, comprising:
a first memory storing sets of under-sampled data associated with an object being imaged, where a set of under-sampled data may include data associated with a static portion of the object and data associated with a dynamic portion of the object;
a second memory storing a dynamic data associated with a frame of interest, where the dynamic data is created by a removal logic by removing data associated with the static portion of the object from a set of under-sampled data;
a third memory storing a static composite data created by a composite logic from the static data, where the static composite data satisfies the Nyquist criteria;
a dynamic calibration logic configured to create a dynamic calibration data set from sets of under-sampled data and the static composite data;
a dynamic reconstruction parameter logic configured to compute a set of dynamic reconstruction parameters from the dynamic calibration data;
a dynamic reconstruction logic configured to reconstruct an image of a dynamic portion of the object based, at least in part, on the dynamic reconstruction parameters and dynamic data associated with the frame of interest;
a static reconstruction logic configured to reconstruct an image of a static portion of the object based, at least in part, on the static composite data; and
a fourth memory storing a combined image produced by a combination logic by combining the image of the dynamic portion of the object and the image of the static portion of the object.

13. The pMRI apparatus of claim 12, where the sets of under-sampled data are acquired from the object being imaged using a time-interleaved acquisition.

14. The pMRI apparatus of claim 12, where the first removal logic subtracts data associated with the static portion of the object from under-sampled data.

15. The pMRI apparatus of claim 12, where the static reconstruction logic performs a Fourier Transform.

16. The pMRI apparatus of claim 12, where the dynamic reconstruction logic performs a partially parallel reconstruction using the dynamic reconstruction parameters and the frame of interest.

17. The pMRI apparatus of claim 16, the partially parallel reconstruction being a generalized auto-calibrating partially parallel acquisition (GRAPPA) reconstruction.

18. The pMRI apparatus of claim 12, where the static reconstruction logic is configured to perform a partially parallel reconstruction using the static composite data.

19. The pMRI apparatus of claim 18, the partially parallel reconstruction being a GRAPPA reconstruction.

* * * * *